(12) United States Patent
Chiu et al.

(10) Patent No.: US 11,211,308 B2
(45) Date of Patent: Dec. 28, 2021

(54) SEMICONDUCTOR DEVICE AND MANUFACTURING METHOD THEREOF

(71) Applicant: GlobalWafers Co., Ltd., Hsinchu (TW)

(72) Inventors: Hsien-Chin Chiu, Hsinchu (TW); Ying-Ru Shih, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 16 days.

(21) Appl. No.: 16/729,504

(22) Filed: Dec. 30, 2019

(65) Prior Publication Data

US 2020/0294881 A1    Sep. 17, 2020

(30) Foreign Application Priority Data

Mar. 12, 2019   (TW) .................................. 108108136

(51) Int. Cl.
*H01L 23/373*    (2006.01)
*H01L 23/367*    (2006.01)
(Continued)

(52) U.S. Cl.
CPC ........ *H01L 23/3735* (2013.01); *H01L 23/367* (2013.01); *H01L 23/3675* (2013.01);
(Continued)

(58) Field of Classification Search
CPC ... H01L 23/36; H01L 23/367; H01L 23/3675; H01L 23/373; H01L 23/3735;
(Continued)

(56) References Cited

U.S. PATENT DOCUMENTS

| 6,555,946 B1 * | 4/2003 | Finder ...................... H03H 3/08 310/324 |
| 7,745,848 B1 * | 6/2010 | Rajagopal ........... H01L 29/0657 257/192 |

(Continued)

FOREIGN PATENT DOCUMENTS

| CN | 101490805 | 7/2009 |
| CN | 104051517 | 9/2014 |

(Continued)

OTHER PUBLICATIONS

Hsien-Chin Chiu et al., "High Performance InAlN/GaN/Si High Electron Mobility Transistor Using Microwave Ohmic Annealing Technique", ECS Journal of Solid State Science and Technology, Sep. 22, 2018, pp. Q185-Q189.

(Continued)

*Primary Examiner* — Maliheh Malek
(74) *Attorney, Agent, or Firm* — JCIPRNET (57) ABSTRACT

A semiconductor device and a manufacturing method thereof are provided. The semiconductor device includes a substrate, a transistor and a heat dissipation structure. The substrate includes first and second semiconductor layers, and includes an insulating layer disposed between the first and second semiconductor layers. The substrate has a recess extending into the insulating layer from a surface of the first semiconductor layer. The transistor includes a hetero-junction structure, a gate electrode, a drain electrode and a source electrode. The hetero-junction structure is disposed on the second semiconductor layer. The gate, drain and source electrodes are disposed over the hetero-junction structure. The gate electrode is located between the drain electrode and the source electrode, and an active area of the hetero-junction structure located between the drain electrode and the source electrode is overlapped with the recess of the (Continued)

substrate. The heat dissipation structure is disposed on the surface of the first semiconductor layer, and extends into the recess.

10 Claims, 9 Drawing Sheets

(51) Int. Cl.
  *H01L 23/42* (2006.01)
  *H01L 29/66* (2006.01)
  *H01L 29/778* (2006.01)
(52) U.S. Cl.
  CPC .......... *H01L 23/3738* (2013.01); *H01L 23/42* (2013.01); *H01L 29/66462* (2013.01); *H01L 29/778* (2013.01)
(58) Field of Classification Search
  CPC . H01L 23/3732; H01L 23/3738; H01L 23/42; H01L 23/467; H01L 29/778; H01L 29/7781; H01L 29/7782; H01L 29/7783; H01L 29/7786; H01L 29/7787
  See application file for complete search history.

(56) References Cited

U.S. PATENT DOCUMENTS

| | | | |
|---|---|---|---|
| 9,246,305 | B1 | 1/2016 | Kub et al. |
| 10,037,899 | B2* | 7/2018 | Gu ................ H01L 29/2003 |
| 10,128,107 | B1* | 11/2018 | Cho ................ H01L 21/02002 |
| 10,868,164 | B2* | 12/2020 | Yoshimochi ........ H01L 23/3677 |
| 2002/0034843 | A1* | 3/2002 | Udrea ................ H01L 21/84 438/149 |
| 2002/0117681 | A1* | 8/2002 | Weeks ................ H01L 29/0657 257/106 |
| 2004/0130002 | A1* | 7/2004 | Weeks ................ H01L 31/1848 257/622 |
| 2008/0067546 | A1* | 3/2008 | Murata ............... H01L 23/3677 257/192 |
| 2008/0197362 | A1* | 8/2008 | Hisamoto ............... H01L 33/34 257/86 |
| 2008/0206977 | A1* | 8/2008 | Frank ................ H01L 21/76898 438/597 |
| 2008/0227246 | A1* | 9/2008 | Chiu .................... H01L 29/7786 438/172 |
| 2009/0146186 | A1* | 6/2009 | Kub ................... H01L 29/66462 257/194 |
| 2009/0194773 | A1* | 8/2009 | Hanson ............... H01L 23/3732 257/77 |
| 2011/0057235 | A1* | 3/2011 | Shim ................. H01L 29/41766 257/194 |
| 2012/0061727 | A1* | 3/2012 | Lee ...................... H01L 29/205 257/183 |
| 2012/0153476 | A1* | 6/2012 | Shen ................. H01L 21/76898 257/750 |
| 2012/0175777 | A1* | 7/2012 | Hill ...................... H01L 23/481 257/753 |
| 2013/0248879 | A1* | 9/2013 | Gambin ............... H01L 29/7786 257/77 |
| 2013/0277845 | A1* | 10/2013 | Chen .................... H01L 23/481 257/762 |
| 2014/0110722 | A1* | 4/2014 | Kub ...................... H01L 23/3732 257/77 |
| 2014/0159049 | A1* | 6/2014 | Ko ..................... H01L 21/76898 257/76 |
| 2014/0264777 | A1* | 9/2014 | Hobart .................. H01L 23/367 257/627 |
| 2014/0264868 | A1* | 9/2014 | Radulescu ........ H01L 21/32139 257/751 |
| 2015/0056763 | A1* | 2/2015 | Hobart .............. H01L 21/02164 438/172 |
| 2015/0270356 | A1* | 9/2015 | Palacios ................ H01L 21/283 257/76 |
| 2015/0294921 | A1* | 10/2015 | Viswanathan ........ H01L 23/481 257/76 |
| 2015/0364591 | A1 | 12/2015 | Lu |
| 2016/0380154 | A1* | 12/2016 | Machuca .......... H01L 21/02609 257/99 |
| 2017/0213821 | A1* | 7/2017 | Or-Bach ........... H01L 21/76251 |
| 2017/0271529 | A1* | 9/2017 | Tan ................. H01L 31/035281 |
| 2017/0294528 | A1 | 10/2017 | Ren et al. |
| 2017/0372945 | A1* | 12/2017 | Howard ................ H01L 21/304 |
| 2018/0068923 | A1* | 3/2018 | Kotani .................. H03F 1/3247 |
| 2019/0252288 | A1* | 8/2019 | Shinagawa ............. C23C 16/50 |
| 2020/0058573 | A1* | 2/2020 | Wu ..................... H01L 23/3738 |
| 2020/0066848 | A1* | 2/2020 | Then .................. H01L 29/2003 |
| 2020/0098906 | A1* | 3/2020 | Shaked ............ H01L 29/66439 |
| 2020/0127115 | A1* | 4/2020 | Chiu .................... H01L 21/0254 |
| 2020/0194394 | A1* | 6/2020 | Shibata ............. H01L 29/66242 |
| 2020/0235026 | A1* | 7/2020 | Kurokawa .......... H01L 29/0813 |
| 2020/0365486 | A1* | 11/2020 | Huang ............... H01L 23/3128 |
| 2020/0381331 | A1* | 12/2020 | Pobedinskas ......... C30B 29/406 |
| 2021/0017669 | A1* | 1/2021 | Huang .................. C30B 25/183 |
| 2021/0050422 | A1* | 2/2021 | Liu ....................... H01L 29/155 |
| 2021/0082910 | A1* | 3/2021 | Or-Bach ................. H01L 24/08 |

FOREIGN PATENT DOCUMENTS

| | | |
|---|---|---|
| CN | 104134689 | 11/2014 |
| CN | 104599957 | 5/2015 |
| CN | 105514065 | 4/2016 |
| CN | 107316852 | 11/2017 |
| CN | 207925478 | 9/2018 |
| JP | 2010067662 | 3/2010 |
| TW | 201044530 | 12/2010 |
| TW | 201145594 | 12/2011 |

OTHER PUBLICATIONS

Hsien-Chin Chiu et al., "High Performance Micromachined GaN on Si HEMT with Backside Diamondlike-Carbon/Titanium Heat Dissipation Layer", Proceedings of the 26th International Symposium on Power Semiconductor Devices & IC's, Jun. 2014, pp. 229-232.
"Office Action of China Counterpart Application", dated Sep. 14, 2021, p. 1-p. 9.

\* cited by examiner

SEMICONDUCTOR DEVICE AND MANUFACTURING METHOD THEREOF

CROSS-REFERENCE TO RELATED APPLICATION

This application claims the priority benefit of Taiwan application serial no. 108108136, filed on Mar. 12, 2019. The entirety of the above-mentioned patent application is hereby incorporated by reference herein and made a part of this specification.

BACKGROUND

Technical Field

The present disclosure is related to a semiconductor device and a manufacturing method thereof, and particularly, to a semiconductor device having a heat dissipation structure and a manufacturing method thereof.

Description of Related Art

Compound semiconductor (e.g., group III-V semiconductor) has advantages such as large bandgap and high carrier mobility, thus the semiconductor device formed of compound semiconductor can be a great candidate for being used in high frequency communication and high power applications. However, problem of heat dissipation usually comes with operation at high frequency and high power. Therefore, improving heat dissipation ability of such semiconductor device is important in the art.

SUMMARY

Accordingly, a semiconductor device with an improved heat dissipation ability and a manufacturing method of this semiconductor device are provided.

In an aspect of the present disclosure, a semiconductor device is provided. The semiconductor device comprises: a substrate, comprising a first semiconductor layer, a second semiconductor layer and an insulating layer disposed between the first semiconductor layer and the second semiconductor layer, wherein the substrate has a recess, and the recess extends into the insulating layer from a surface of the first semiconductor layer; a transistor, comprising a hetero-junction structure, a gate electrode, a drain electrode and a source electrode, wherein the hetero-junction structure is disposed on the second semiconductor layer, the gate electrode, the drain electrode and the source electrode are disposed on the hetero-junction structure, the gate electrode is located between the drain electrode and the source electrode, and an active area of the hetero-junction structure between the drain electrode and the source electrode is overlapped with the recess of the substrate; and a heat dissipation structure, disposed on the surface of the first semiconductor layer, and extending into the recess.

In some embodiments, the recess is further overlapped with the drain electrode and the source electrode.

In some embodiments, an area of an orthogonal projection of the recess on the second semiconductor layer is greater than or equal to an area of an orthogonal projection of the hetero-junction structure on the second semiconductor layer.

In some embodiments, the heat dissipation structure comprises a plurality of multilayer structures stacking on one another, each multilayer structure comprises an adhesive layer and a heat dissipation layer, and the adhesive layer is closer to the substrate than the heat dissipation layer in the same multilayer structure.

In some embodiments, a ratio of a thickness of the heat dissipation layer with respect to a thickness of the adhesive layer ranges from 3:1 to 4:1.

In some embodiments, an amount of the multilayer structures ranges from 4 to 6.

In some embodiments, the hetero-junction structure comprises a channel layer, a spacer layer and a barrier layer, wherein the channel layer is disposed between the second semiconductor layer of the substrate and the barrier layer, and the spacer layer is located between the channel layer and the barrier layer.

In some embodiments, a portion of the insulating layer overlapped with a bottom surface of the recess has a first thickness, another portion of the insulating layer not overlapped with the recess has a second thickness, and a ratio of the first thickness with respect to the second thickness ranges from 0.4 to 0.6.

In some embodiments, the semiconductor device further comprises a buffer layer. The buffer layer is disposed between the second semiconductor layer of the substrate and the transistor.

In another aspect of the present disclosure, a manufacturing method of a semiconductor device is provided. The manufacturing method of the semiconductor device comprises: providing a substrate, wherein the substrate comprises a first semiconductor layer, a second semiconductor layer and an insulating layer disposed between the first semiconductor layer and the second semiconductor layer; forming a transistor on the second semiconductor layer of the substrate, wherein the transistor comprises a hetero-junction structure and a gate electrode, a drain electrode and a source electrode disposed on the hetero-junction structure, and the gate electrode is located between the drain electrode and the source electrode; forming a recess at a surface of the substrate, wherein the recess extends into the insulating layer from a bottom surface of the first semiconductor layer; and forming a heat dissipation structure on the surface of the substrate, wherein the heat dissipation structure extends into the recess.

In some embodiments, the manufacturing method of the semiconductor device further comprises: thinning the first semiconductor layer before forming the recess.

As above, the semiconductor device according to embodiments of the present disclosure includes a transistor formed at a front side of a substrate, and further includes a heat dissipation structure disposed at a back side of a substrate. By disposing the heat dissipation structure, thermal energy generated by the transistor can be dissipated through the substrate and the heat dissipation structure. The substrate may be a semiconductor-on-insulator (SOI) substrate, and the back side of the substrate has a recess. The recess is overlapped with the active area of the transistor, and extends into the insulating layer of the substrate from the back side of the substrate. In this way, the heat dissipation structure may extend into the recess, and is in contact with the insulating layer. Therefore, thermal energy accumulated in the insulating layer that has a relatively low thermal conductivity can be effectively dissipated through the heat dissipation structure. As a result of improvement of heat dissipation ability, reliability of the semiconductor device can be improved. On the other hand, a portion of the substrate outside the recess may have a relatively large thickness, so as to provide sufficient mechanical strength to the semiconductor device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
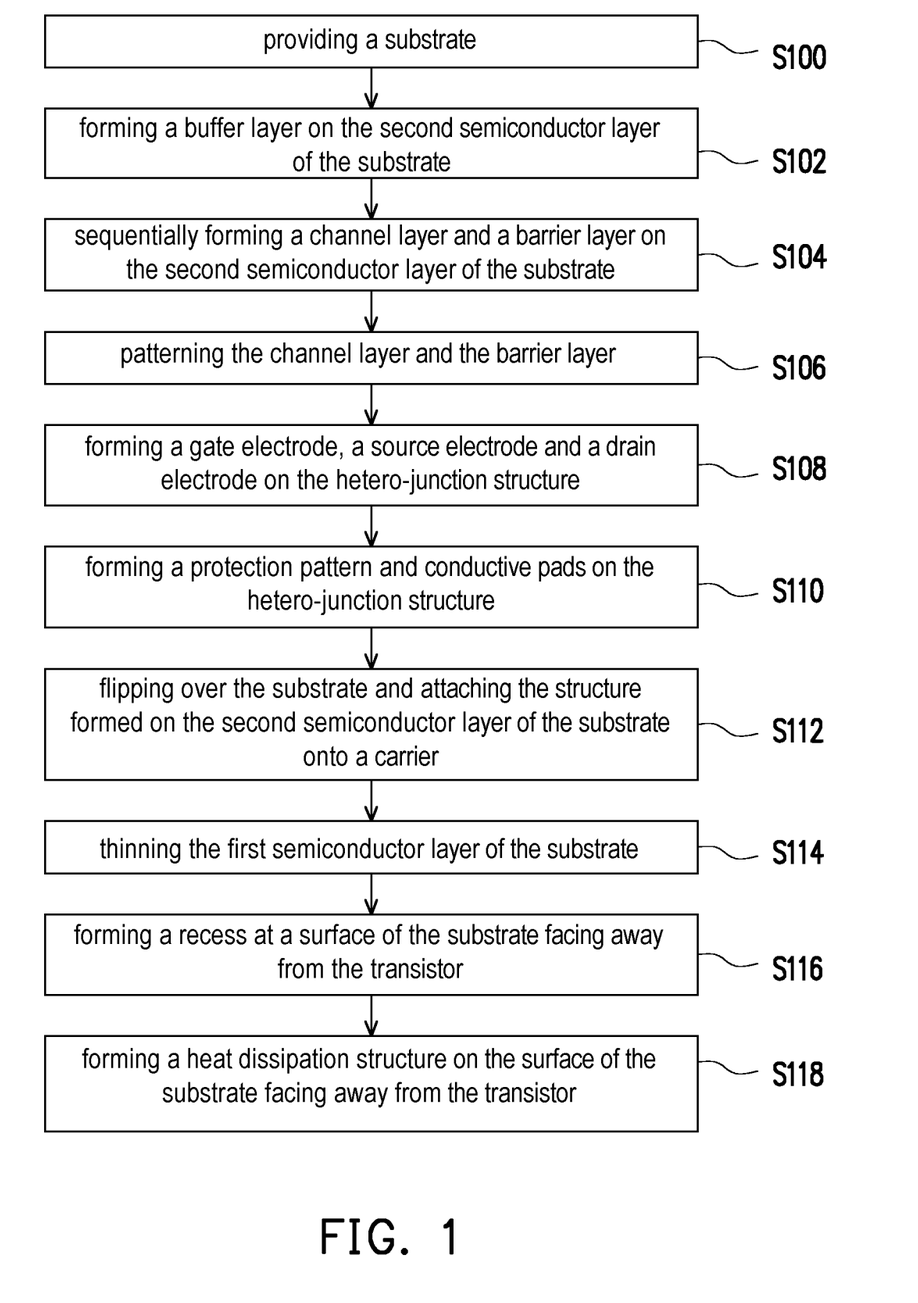
FIG. 1 is a process flow diagram illustrating a manufacturing method of a semiconductor device according to some embodiments of the present disclosure.

FIG. 1 is a process flow diagram illustrating a manufacturing method of a semiconductor device 10 according to some embodiments of the present disclosure. FIG. 2A through FIG. 2G are schematic cross-sectional views illustrating structures at various stages during the manufacturing method of the semiconductor device 10 as shown in FIG. 1.

Figure 2A:
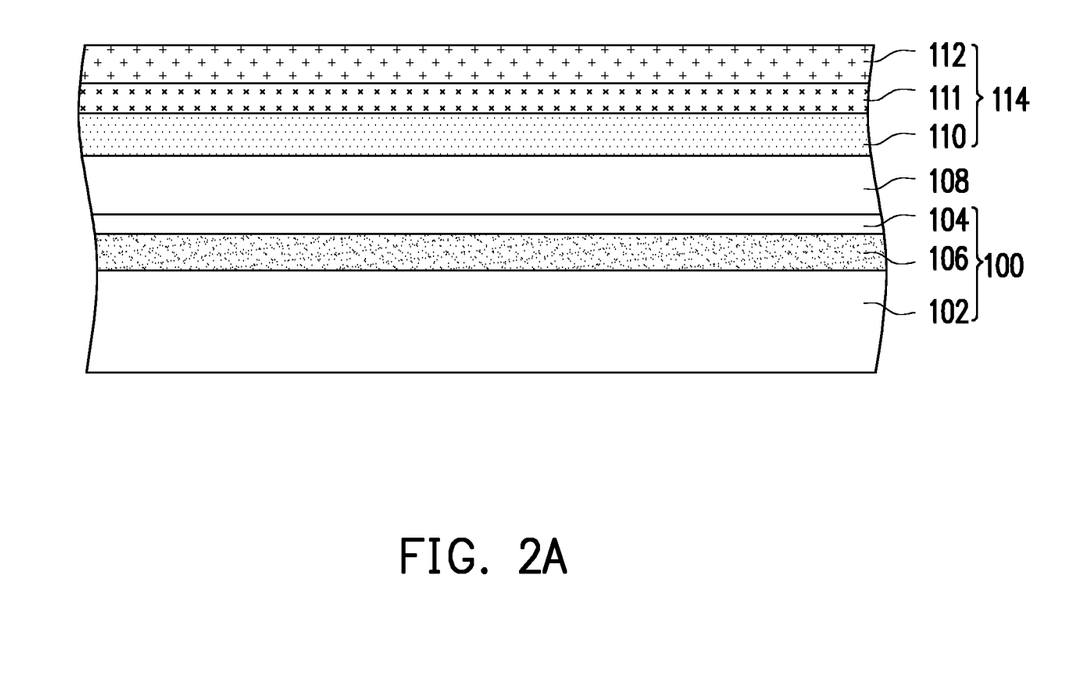
FIG. 2A through FIG. 2G are schematic cross-sectional views illustrating structures at various stages during the manufacturing method of the semiconductor device as shown in FIG. 1.

Referring to FIG. 1 and FIG. 2A, step S100 is performed, and a substrate 100 is provided. In some embodiments, the substrate 100 may be a semiconductor-on-insulator (SOI) wafer. In these embodiments, the substrate 100 may include a first semiconductor layer 102, a second semiconductor layer 104 and an insulating layer 106 disposed between the first semiconductor layer 102 and the second semiconductor layer 104. The first semiconductor layer 102 and the second semiconductor layer 104 are respectively made of a semiconductor material, whereas the insulating layer 106 is made of an insulating material. For instance, the semiconductor material may be silicon, and the insulating material may be silicon oxide. In some embodiments, the first semiconductor layer 102 has a thickness greater than a thickness of the second semiconductor layer 104. In these embodiments, the thickness of the first semiconductor layer 102 may range from 600 μm to 625 μm, and the thickness of the second semiconductor layer 104 may range from 5 μm to 10 μm. On the other hand, a thickness of the insulating layer 106 may range from 0.5 μm to 1 μm.

In some embodiments, step S102 is performed, and a buffer layer 108 is formed on the second semiconductor layer 104 of the substrate 100. In some embodiments, substantially the entire second semiconductor layer 104 of the substrate 100 is covered by the buffer layer 108. In some embodiments, a material of the buffer layer 108 may include a nitride of a group III element or a group III-V compound semiconductor. For instance, the material of the buffer layer 108 may include InAlGaN, AlGaN, AlInN, InGaN, AlN, GaN or combinations thereof. A method for forming the buffer layer 108 may include an epitaxial process. In some embodiments, a thickness of the buffer layer 108 ranges from 1.2 μm to 2 μm. By disposing the buffer layer 108, stress induced by lattice constant mismatch and/or coefficient of thermal expansion (CTE) difference between the substrate 100 and the subsequently formed layers (e.g., the channel layer 110 or the spacer layer 111).

Step S104 is performed, and a channel layer 110 and a barrier layer 112 are sequentially formed on the second semiconductor layer 104 of the substrate 100. In other words, the channel layer 110 may be located between the barrier layer 112 and the second semiconductor layer 104 of the substrate 100. In those embodiments where the buffer layer 108 is formed on the second semiconductor layer 104 of the substrate 100, the channel layer 110 may be located between the buffer layer 108 and the barrier layer 112. Materials of the channel layer 110 and the barrier layer 112 may respectively include a nitride of a group III element or a group III-V compound semiconductor, and are different from each other. For instance, the material of the channel layer 110 may be GaN, whereas the material of the barrier layer 112 may be InAlN, AlGaN, InAlGaN, the like or combinations thereof. In addition, a thickness of the channel layer 110 may range from 200 nm to 300 nm, whereas a thickness of the barrier layer 112 may range from 15 nm to 20 nm. In some embodiments, the channel layer 110 and the barrier layer 112 may be formed by epitaxial processes. Moreover, in some embodiments, a spacer layer 111 may be disposed between the channel layer 110 and the barrier layer 112. A material of the spacer layer 111 may include AlN. A thickness of the spacer layer 111 may range from 0.5 nm to 2 nm. In addition, the spacer layer 111 may also be formed by an epitaxial process.

Figure 2B:
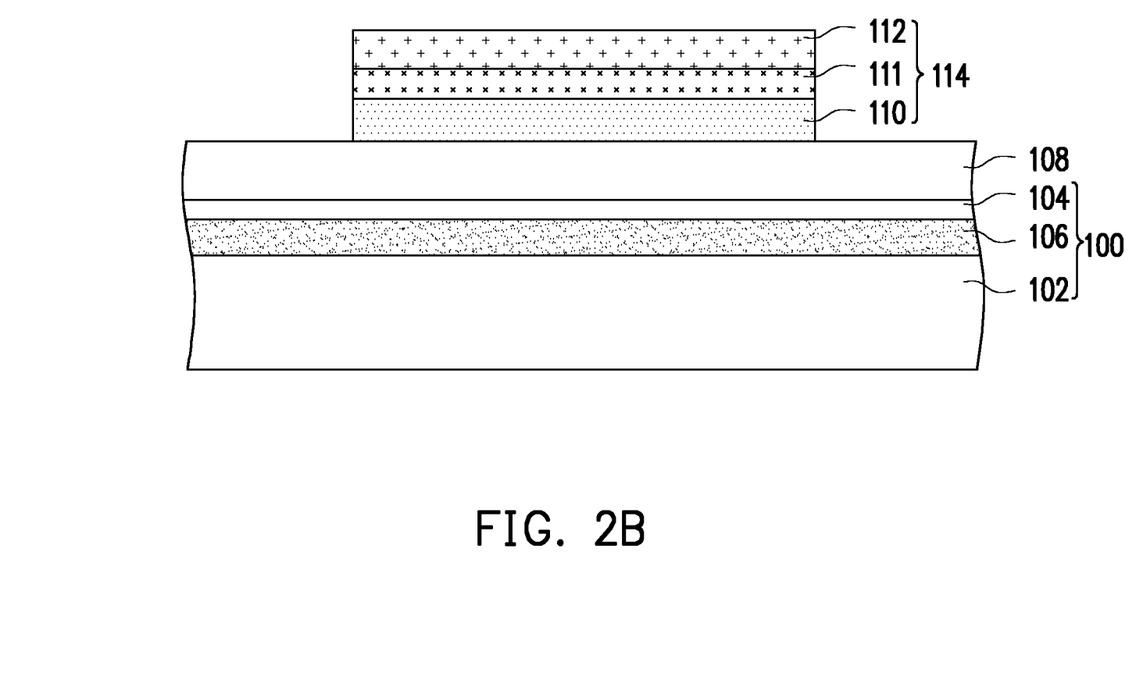

Referring to FIG. 1 and FIG. 2B, step S106 is performed, and the channel layer 110 and the barrier layer 112 are patterned. In this way, a hetero-junction structure 114 including the patterned channel layer 110 and barrier layer 112 is formed. In those embodiments where the spacer layer 111 is disposed between the channel layer 110 and the barrier layer 112, the spacer layer 111 may be patterned along with the channel layer 110 and the barrier layer 112 during the step S106. In these embodiments, the hetero-junction structure 114 may further include the patterned spacer layer 111. A method for patterning the channel layer 110, the spacer layer 111 and the barrier layer 112 may include a lithography process and an etching process. In addition, the buffer layer 108 may be functioned as an etching stop layer during the etching process. Even though only a single hetero-junction structure 114 is depicted in FIG. 2B, multiple hetero-junction structures 114 may be actually formed on the substrate 100, and these hetero-junction structures 114 may be laterally separated from one another. Those skilled in the art may adjust dimensions of each hetero-junction structure 114 and spacing between adjacent hetero-junction structures 114 according to design requirements, the present disclosure is not limited thereto.

Figure 2C:
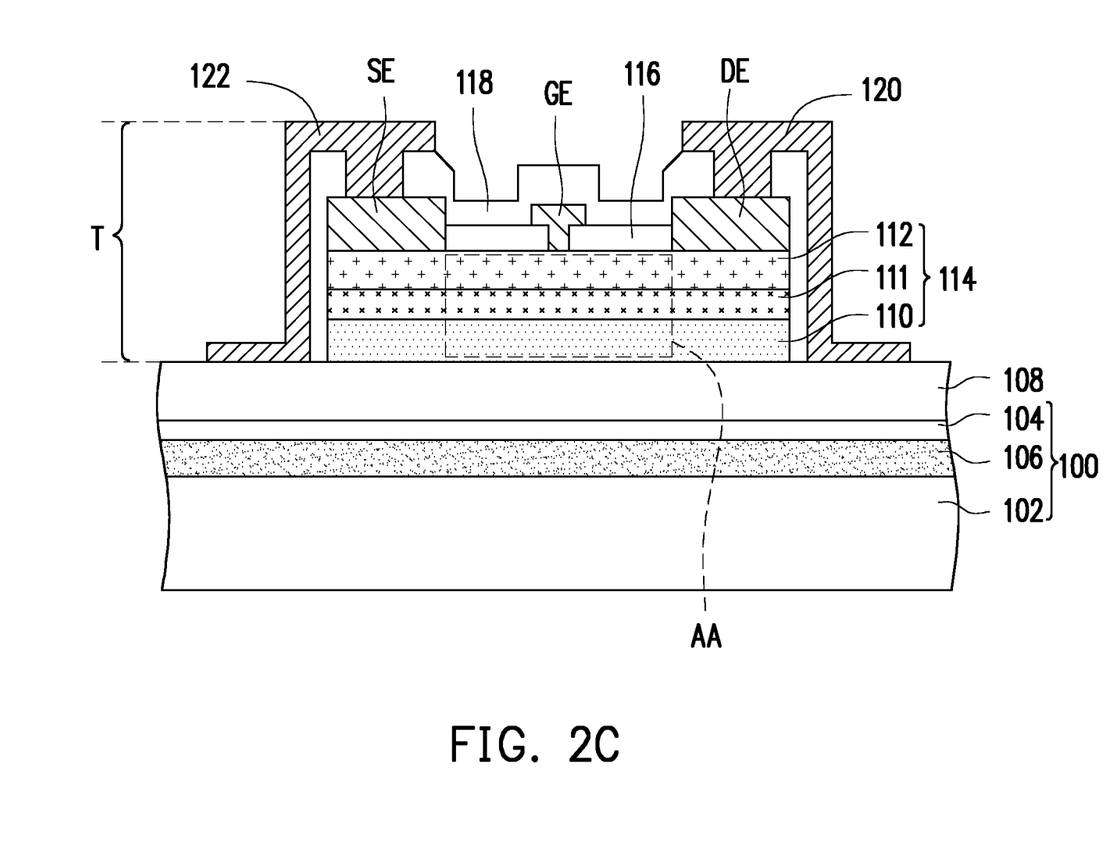

Referring to FIG. 1 and FIG. 2C, step S108 is subsequently performed, and a gate electrode GE, a drain electrode DE and a source electrode SE are formed on the hetero-junction structure 114. In some embodiments, a method for forming the gate electrode GE, the drain electrode DE and the source electrode SE includes forming an insulating pattern 116 having multiple openings on a top surface of the barrier layer 112, and then filling a conductive material into these openings, to form the gate electrode GE, the drain electrode DE and the source electrode SE. The insulating pattern 116 is made of an insulating material (e.g., silicon oxide). A material of the gate electrode GE may include metal or metal nitride (e.g., Ta, TaN, Ti, TiN, W, Pd, Ni, Au, Al or combinations thereof), metal silicide (e.g., $WSi_x$) or other suitable material that could form schottky contact with the barrier layer 112. In addition, materials of the drain electrode DE and the source electrode SE may respectively include Ti, Al, Ni, Au, or other material that could form ohmic contact with the barrier layer 112. In some embodiments, a thickness of the gate electrode GE may range from 150 nm to 200 nm, whereas the drain electrode DE and the source electrode SE may respectively have a thickness ranging from 330 nm to 350 nm. A method for forming the gate electrode GE, the drain electrode DE and the source electrode SE may include a chemical vapor deposition (CVD) process, a physical vapor deposition (PVD) process (e.g., a sputtering process) or a combination thereof.

Referring to FIG. 1 and FIG. 2C, in some embodiments, step S110 is performed, and a protection pattern 118, a conductive pad 120 and a conductive pad 122 are formed on the hetero-junction structure 114. A body portion of the protection patter 118 partially covers top surfaces of the gate electrode GE, the drain electrode DE and the source electrode SE, and may cover a top surface of the insulating pattern 116. In addition, the protection pattern 118 may have openings exposing the drain electrode DE and the source electrode SE. Although not depicted in FIG. 2C, the protection pattern 118 may further have an opening exposing the gate electrode GE. In some embodiments, the protection pattern 118 further extends onto sidewalls of the drain electrode DE, the source electrode SE and the hetero-junction structure 114. In some embodiments, a material of the protection pattern 118 may include silicon oxide, silicon nitride, other insulating material or combinations thereof. On the other hand, the conductive pad 120 and the conductive pad 122 partially cover the protection pattern 118, and extend into the openings exposing the drain electrode DE and the source electrode SE, respectively. The conducive pad 120 and the conductive pad 122 are respectively formed of a conductive material, such as Ti, Au, the like or combinations thereof. In this way, the conductive pad 120 and the conductive pad 122 could be electrically connected to the drain electrode DE and the source electrode SE, respectively. In some embodiments, the conductive pad 120 and the conductive pad 122 extend to a sidewall of the hetero-junction 114 along a surface of the protection pattern 118, and may further extend onto portions of the substrate 100 (or the buffer layer 108) at opposite sides of the hetero-junction structure 114.

Up to here, a transistor T has been formed on the substrate 100 (or the buffer layer 108). The transistor T may be a high electron mobility transistor (HEMT). The hetero-junction structure 114 of the transistor T includes at least two different compound semiconductors, and two-dimensional electron gas or two-dimensional hole gas may be induced at the hetero-junction structure 114 by spontaneous polarization effect and piezoelectric polarization effect. This two-dimensional electron gas or two-dimensional hole gas may be functioned as a conductive channel of the transistor T. Whether the conductive channel is cut off can be controlled by the gate electrode GE of the transistor T. When the conductive channel continuously extends in the hetero-junction structure 114, electrical current flows through an active area AA of the hetero-junction structure 114 between the drain electrode DE and the source electrode SE, and the transistor T is in an on-state. On the other hand, when the conductive channel is cut off, the transistor T is in an off-state.

In some embodiments, an interconnection structure (not shown) may be further formed on the transistor T. The interconnection structure may be configured to interconnect different transistors T. In addition, signals can be provided to or output from the transistor T through the interconnection structure.

Figure 2D:
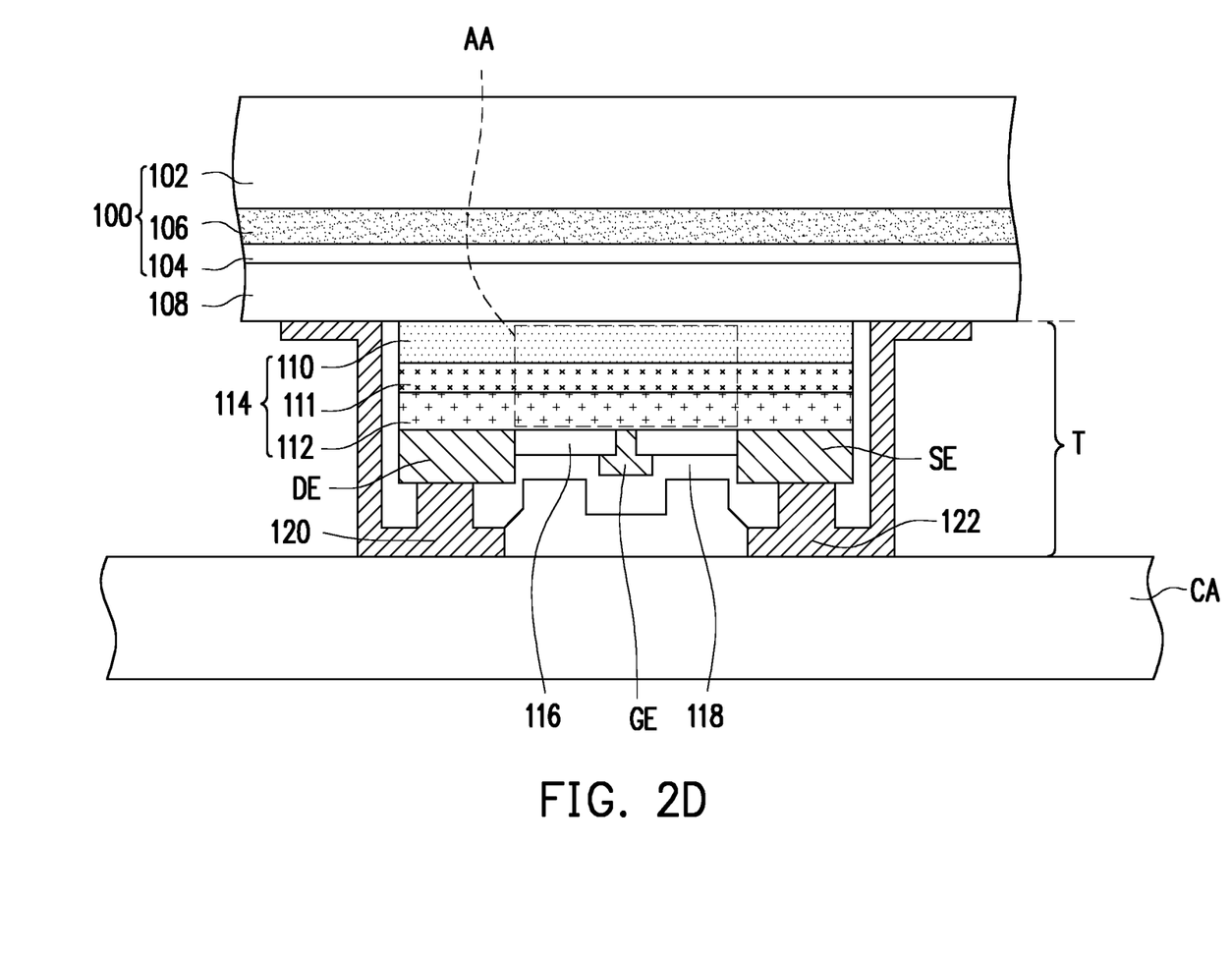

Referring to FIG. 1 and FIG. 2D, in some embodiments, step S112 is performed, such that the substrate 100 is flipped over, and the structure formed over the second semiconductor layer 104 of the substrate 100 is attached onto a carrier CA. In some embodiments, the structure shown in FIG. 2C is flipped over, and attached to the carrier CA from above the carrier CA. As such, the first semiconductor layer 102 of the substrate 100 faces upwardly, whereas the transistor T and the interconnection structure (not shown) face toward the carrier CA. In addition, in some embodiments, an adhesive layer (not shown) may be preliminarily formed on a surface of the carrier CA. In this way, the structure formed on the second semiconductor layer 104 of the substrate 100 may be attached to the carrier CA through the adhesive layer. For instance, the adhesive layer may be a light-to-heat-conversion (LTHC) release layer.

Figure 2E:
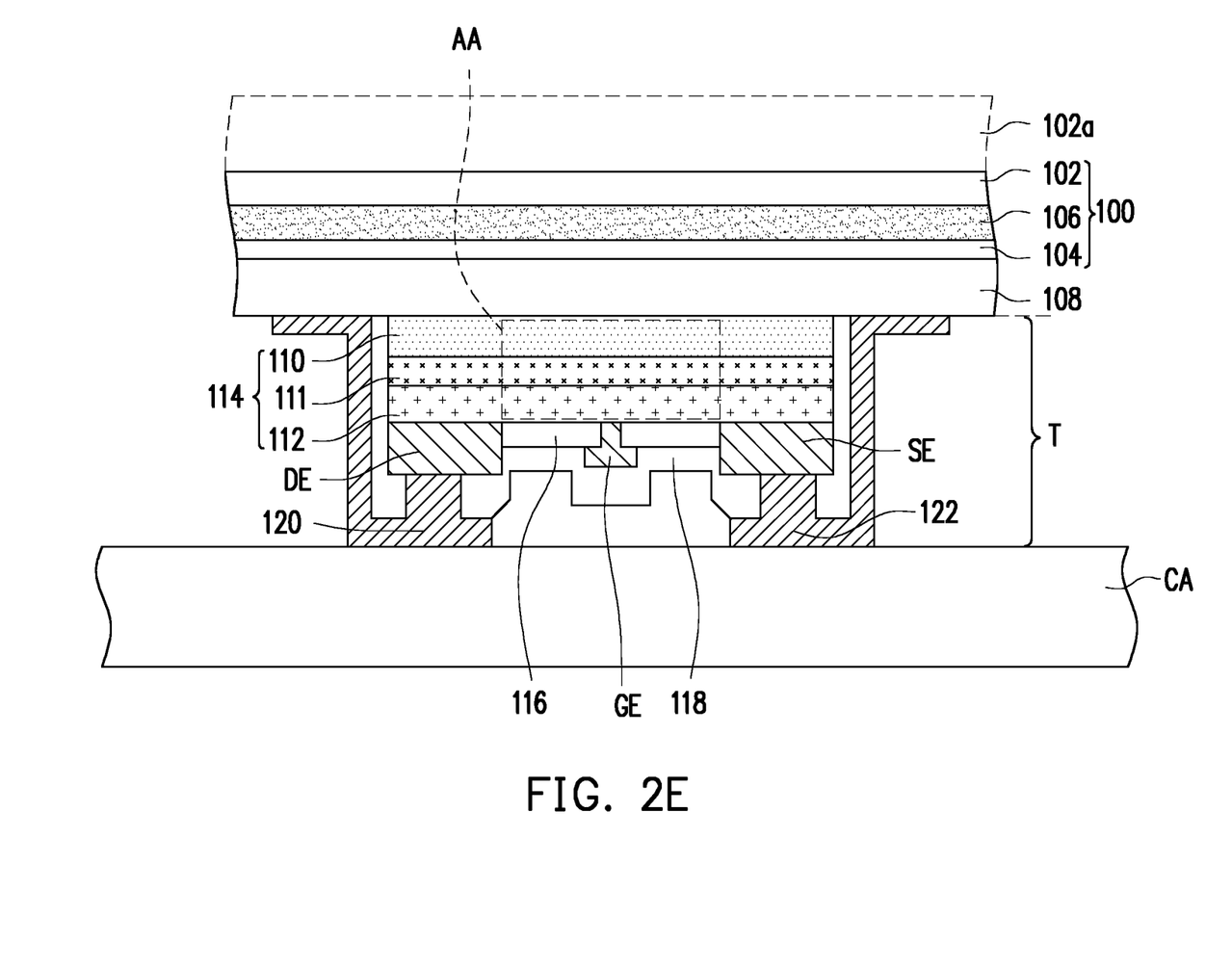

Referring to FIG. 1 and FIG. 2E, step S114 is performed, and the first semiconductor layer 102 of the substrate 100 is thinned. For instance, a portion 102a of the first semiconductor layer 102 is removed from a surface of the first semiconductor layer 102 facing away from the second semiconductor layer 104 by a mechanical polishing process, so as to perform thinning on the first semiconductor layer 102. In some embodiments, a ratio of a thickness of the remained first semiconductor layer 102 with respect to a thickness of the un-thinned first semiconductor layer 102 ranges from 1:5 to 1:6.

Figure 2F:
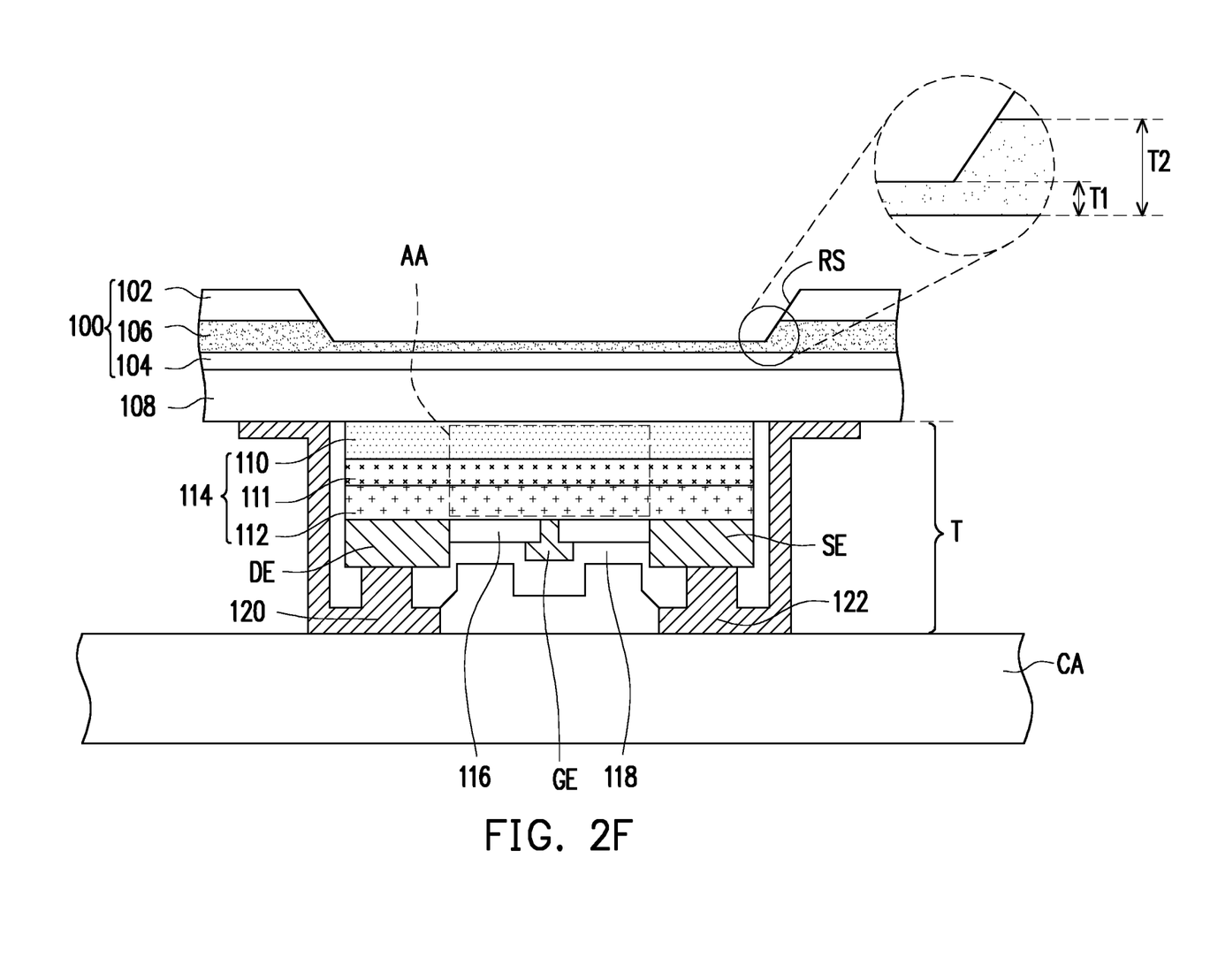

Referring to FIG. 1 and FIG. 2F, step S116 is performed, and a recess RS is formed at a surface of the substrate 100 facing away from the transistor T. The recess RS extend into the substrate 100 from a surface of the first semiconductor layer 102. In addition, the recess RS is overlapped with the active area AA of the hetero-junction structure 114 located between the drain electrode DE and the source electrode SE. In this way, thermal energy generated by the transistor T can be dissipated through the heat dissipation structure 124 subsequently formed in the recess RS of the substrate 100. Particularly, thermal energy generated from the active area AA of the transistor T can be effectively dissipated through the heat dissipation structure 124. On the other hand, portions of the substrate 100 outside the recess RS still have a relatively large thickness, so as to provide sufficient mechanical strength. In some embodiments, the recess RS is further overlapped with the drain electrode DE and the source electrode SE. In these embodiments, an area of an orthogonal projection of the recess RS on the second semiconductor layer 104 may be greater than or equal to an area of an orthogonal projection of the hetero-junction structure 114 on the semiconductor layer 104. In some embodiments, an area of the recess RS may range from $10^4$ $\mu m^2$ to $2.25 \times 10^4$ $\mu m^2$. In addition, a ratio of a depth of the recess RS with respect to a thickness of the thinned substrate 100 may be less than 1, and greater than or equal to 0.67. A method for forming the recess RS includes a lithography process and an etching process. In some embodiments, a photoresist pattern (not shown) may be formed on the first semiconductor layer 102. The photoresist pattern has an opening for defining location of the recess RS. Subsequently, an etching process may be performed on the first semiconductor layer 102 by using the photoresist pattern as a shadow mask, so as to form the recess RS. Thereafter, the photoresist pattern may be removed.

In some embodiments, the recess RS extends into the insulating layer 106, which is less thermally conductive than the first and second semiconductor layers 102, 104, from the surface of the first semiconductor layer 102. In this way, thermal energy accumulated in the substrate 100 can be more effectively dissipated through the heat dissipation structure 124 subsequently formed in the recess RS. In these embodiments, a method for forming the recess RS further includes removing a portion of the insulating layer 106. As such, an exposed top surface of the insulating layer 106 may define a bottom surface of the recess RS, and exposed sidewalls of the insulating layer 106 and the first semiconductor layer 102 may collectively define a sidewall of the recess RS. A portion of the insulating layer 106 overlapped with the bottom surface of the recess RS has a thickness T1, wherein another portion of the insulating layer 106 not overlapped with the recess RS has a thickness T2. In some embodiments, a ratio of the thickness T1 with respect to the thickness T2 ranges from 0.4 to 0.6.

Figure 2G:
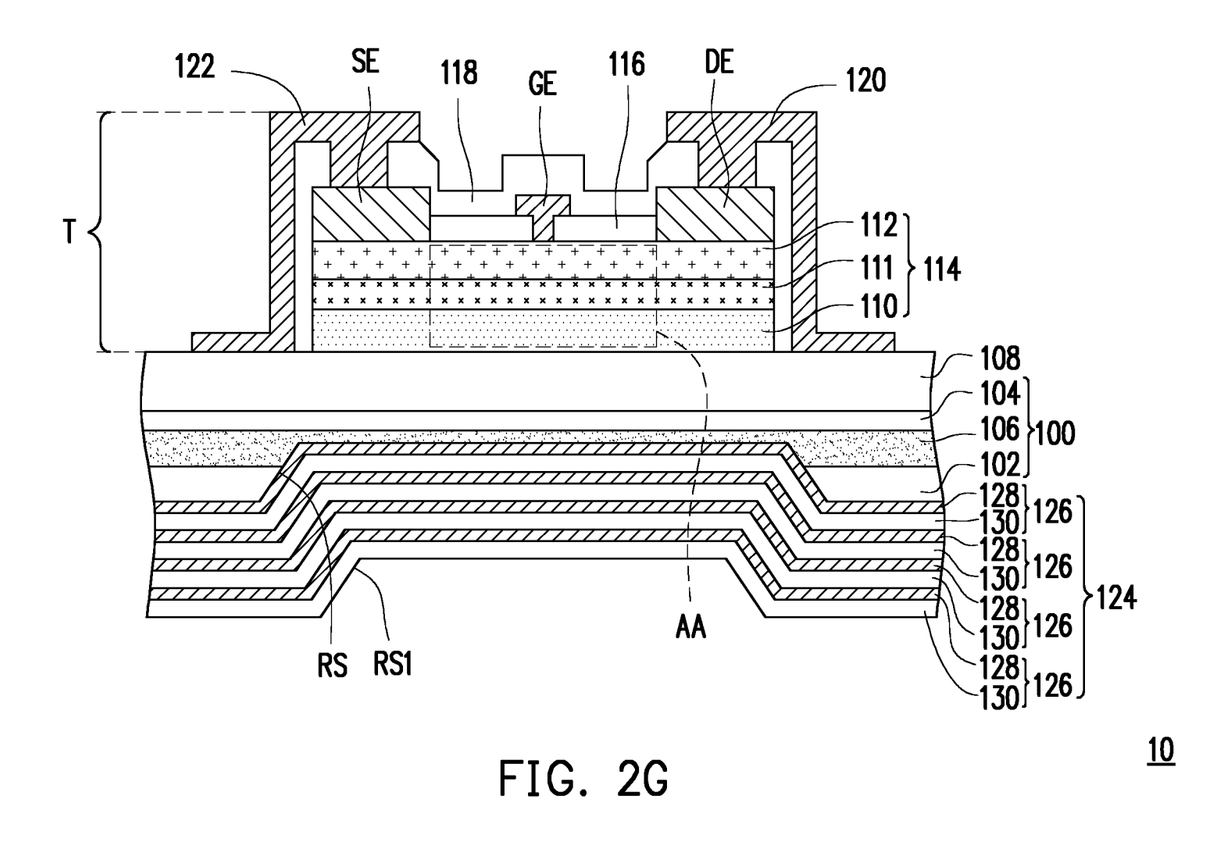

Referring to FIG. 1 and FIG. 2G, step S118 is performed, and a heat dissipation structure 124 is formed on a surface of the substrate 100 facing away from the transistor T. Thereafter, the carrier CA may be removed, and the current structure may be flipped over, so as to form the structure shown in FIG. 2G. The heat dissipation structure 124 extends into the recess RS from above the surface of the first semiconductor layer 102. In those embodiments where the recess RS extends into the insulating layer 106, the heat dissipation structure 124 may be in contact with the insulating layer 106. In some embodiments, the heat dissipation structure 124 includes a plurality of multilayer structures 126 stacking over one another. Each multilayer structure 126 may include an adhesive layer 128 and a heat dissipation layer 130. In each multilayer structure 126, the adhesive layer 128 is closer to the substrate 100 than the heat dissipation layer 130. In other words, the adhesive layers 128 and the heat dissipation layers 130 may be alternately arranged along a direction away from the substrate 100. By disposing the adhesive layers 128, adhesion between the heat dissipation layers 130 and the substrate 100 as well as adhesion between heat dissipation layers 130 can be improved. In some embodiments, the adhesive layers 128 are made of a metal material. In these embodiments, the adhesive layers 128 are not only beneficial to adhesion, but also advantageous to heat dissipation. For instance, the material of the adhesive layers 128 may include Ti. Moreover, the heat dissipation layers 130 may be made of a material having high thermal conductivity (such as greater than 600 W/mK). For instance, the heat dissipation layers 130 may be made of diamond-like carbon (DLC) films. In some embodiments, the heat dissipation structure 124 includes 4 to 6 multilayer structures 126. In each multilayer structure 126, a ratio of a thickness of the heat dissipation layer 130 with respect to a thickness of the adhesive layer 128 may range from 3:1 to 4:1. For instance, the thickness of the heat dissipation layer 130 may range from 1500 nm to 2000 nm, whereas the thickness of the adhesive layer 128 may range from 500 nm to 600 nm.

In some embodiments, the heat dissipation structure 124 is conformally formed on the surface of the substrate 100. In this way, a surface of the heat dissipation 124 may have a recess RS1 in corresponding to the recess RS of the substrate 100. A depth of the recess RS1 may be less than the depth of the recess RS. In addition, the depth of the recess RS1 may be decreased as an amount of the multilayer structures 126 increases. In alternative embodiments, the heat dissipation structure 124 has a substantially flat surface, which is free of a recess. In these alternative embodiments, the amount of the multilayer structures 126 in the heat dissipation structure 124 may be greater than 5.

Up to here, the semiconductor device 10 has been formed. The semiconductor device 10 includes the transistor T formed at a front side of the substrate 100, and further includes the heat dissipation structure 124 disposed at a back side of the substrate 100. By disposing the heat dissipation structure 124, the thermal energy generated by the transistor T can be dissipated through the substrate 100 and the heat dissipation structure 124. The substrate 100 may be a SOI substrate, and the back side of the substrate 100 has the recess RS. The recess RS is overlapped with the active area AA of the transistor T, and extends into the insulating layer 106 of the substrate 100 from the back side of the substrate 100. In this way, the heat dissipation structure 124 may extend into the recess RS, and is in contact with the insulating layer 106. Therefore, thermal energy accumulated in the insulating layer 106 that has a relatively low thermal conductivity can be effectively dissipated through the heat dissipation structure 124. As a result of improvement of heat dissipation ability, reliability of the semiconductor device 10 can be improved. On the other hand, the portion of the substrate 100 outside the recess RS may have a relatively large thickness, so as to provide sufficient mechanical strength to the semiconductor device 10.

Figure 3:
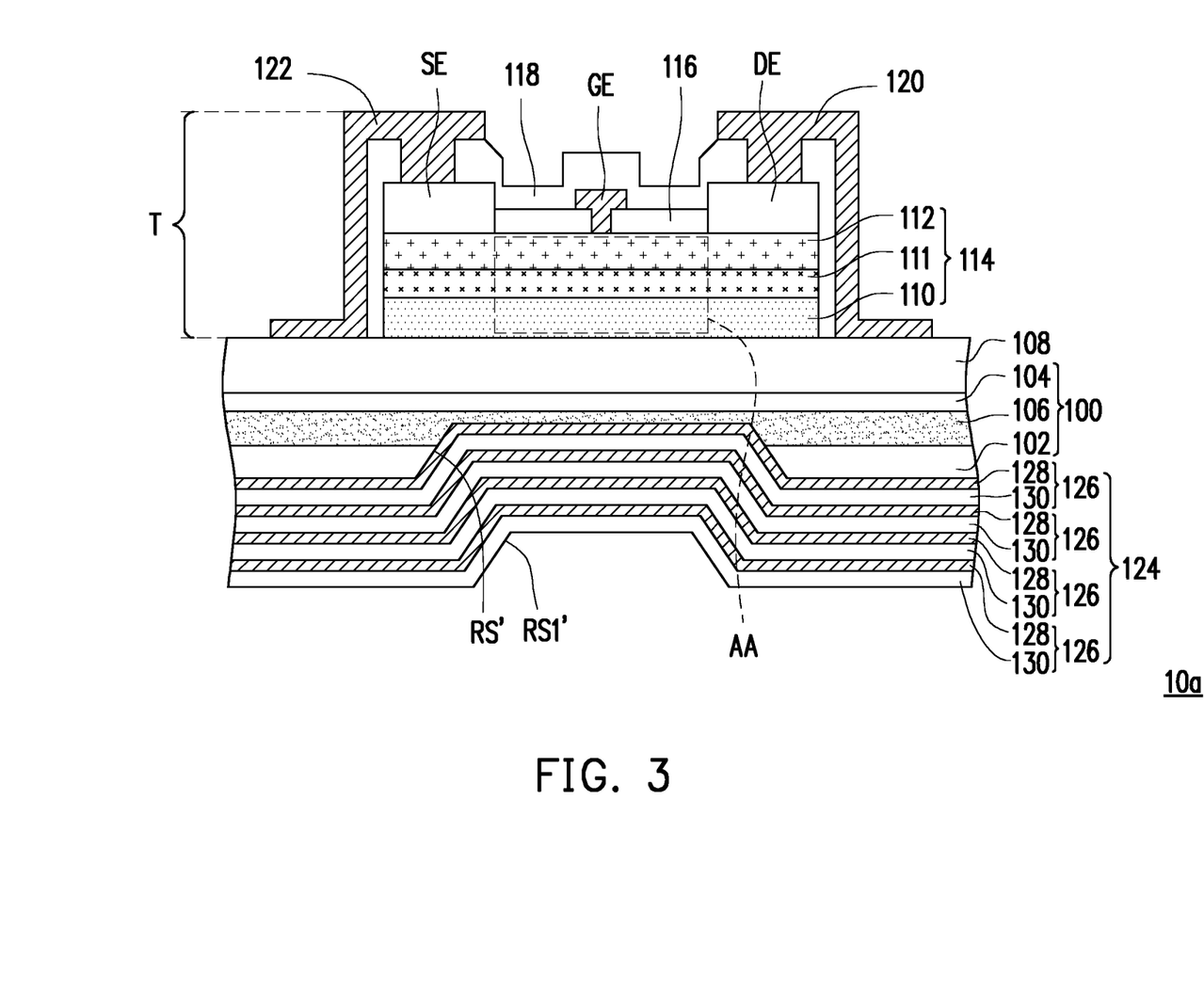
FIG. 3 is a schematic cross-sectional view illustrating a semiconductor device according to other embodiments of the present disclosure.

FIG. 3 is a schematic cross-sectional view illustrating a semiconductor device 10a according to other embodiments of the present disclosure.

Referring to FIG. 2G and FIG. 3, the semiconductor device 10a shown in FIG. 3 is similar to the semiconductor device 10 as shown in FIG. 2G. Only the difference therebetween will be described, the same or the like parts would not be repeated again. In addition, the same or the like labels are referred to the same or the like components (e.g., the recess RS' as shown in FIG. 3 and the recess RS as shown in FIG. 2G). Referring to FIG. 3, an area of an orthogonal projection of the recess RS' on the second semiconductor layer 104 is smaller than an area of an orthogonal projection of the hetero-junction structure 114 on the second semiconductor layer 104. As such, the hetero-junction structure 114 is not entirely overlapped with the recess RS'. In some embodiments, substantially the entire active area AA of the hetero-junction structure 114 is overlapped with the recess RS', whereas other area of the hetero-junction structure 114 is not entirely overlapped with the recess RS'. In these embodiments, the drain electrode DE and the source electrode SE of the transistor T are partially overlapped with the recess RS', rather than entirely overlapped with the recess RS'.

Since the recess RS' at the back side of the substrate 100 is still overlapped with the active area AA of the transistor T and extending into the insulating layer 106, thus thermal energy generated by the transistor T can still be effectively dissipated through the substrate 100 and the heat dissipation structure 124 formed at the back side of the substrate 100. Moreover, since the recess RS' of the substrate 100 has a relatively small area, a mechanical strength of the substrate 100 can be improved. Furthermore, the recess RS1' in corresponding to the recess RS' could have a relatively small area.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a substrate, comprising a first semiconductor layer, a second semiconductor layer and an insulating layer disposed between the first semiconductor layer and the second semiconductor layer, wherein the substrate has a recess, and the recess extends into the insulating layer from a surface of the first semiconductor layer, a recessed surface of the insulating layer defines a top surface of the recess, and a recessed portion of the insulating layer has a first thickness less than a second thickness of portions of the insulating layer aside the recess;
   a transistor, comprising a hetero-junction structure, a gate electrode, a drain electrode and a source electrode, wherein the hetero-junction structure is disposed on the second semiconductor layer, the gate electrode, the drain electrode and the source electrode are disposed on the hetero-junction structure, the gate electrode is located between the drain electrode and the source electrode, and an active area of the hetero-junction structure between the drain electrode and the source electrode is overlapped with the recess of the substrate; and
   a heat dissipation structure, disposed on the surface of the first semiconductor layer, and extending into the recess.

2. The semiconductor device according to claim 1, wherein the recess is further overlapped with the drain electrode and the source electrode.

3. The semiconductor device according to claim 2, wherein an area of an orthogonal projection of the recess on the second semiconductor layer is greater than or equal to an area of an orthogonal projection of the hetero-junction structure on the second semiconductor layer.

4. The semiconductor device according to claim 1, wherein the heat dissipation structure comprises a plurality of multilayer structures stacking on one another, each multilayer structure comprises an adhesive layer and a heat dissipation layer, and the adhesive layer is closer to the substrate than the heat dissipation layer in the same multilayer structure.

5. The semiconductor device according to claim 4, wherein a ratio of a thickness of the heat dissipation layer with respect to a thickness of the adhesive layer ranges from 3:1 to 4:1.

6. The semiconductor device according to claim 4, wherein an amount of the multilayer structures ranges from 4 to 6.

7. The semiconductor device according to claim 1, wherein the hetero-junction structure comprises a channel layer, a spacer layer and a bather layer, wherein the channel layer is disposed between the second semiconductor layer of the substrate and the barrier layer, and the spacer layer s located between the channel layer and the barrier layer.

8. The semiconductor device according to claim 1, wherein a ratio of the first thickness with respect to the second thickness ranges from 0.4 to 0.6.

9. A manufacturing method of a semiconductor device, comprising:
   providing a substrate, wherein the substrate comprises a first semiconductor layer, a second semiconductor layer and an insulating layer disposed between the first semiconductor layer and the second semiconductor layer;
   forming a transistor on the second semiconductor layer of the substrate, wherein the transistor comprises a hetero-junction structure and a gate electrode, a drain electrode and a source electrode disposed on the hetero-junction structure, and the gate electrode is located between the drain electrode and the source electrode;
   forming a recess at a surface of the substrate, wherein the recess extends into the insulating layer from a bottom surface of the first semiconductor layer, a recessed surface of the insulating layer defines a top surface of the recess, and a recessed portion of the insulating layer has a first thickness less than a second thickness of portions of the insulating layer aside the recess; and
   forming a heat dissipation structure on the surface of the substrate, wherein the heat dissipation structure extends into the recess.

10. The manufacturing method of the semiconductor device according to claim 9, further comprising thinning the first semiconductor layer before forming the recess.

* * * * *